United States Patent
Vogel et al.

(10) Patent No.: US 8,274,034 B2
(45) Date of Patent: Sep. 25, 2012

(54) OPTICAL ARRANGEMENT COMPRISING EMITTERS AND DETECTORS ON A COMMON SUBSTRATE

(75) Inventors: Uwe Vogel, Dresden (DE); Jorg Amelung, Dresden (DE); Daniel Kreye, Dresden (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 952 days.

(21) Appl. No.: 11/763,035

(22) Filed: Jun. 14, 2007

(65) Prior Publication Data
US 2010/0012817 A1    Jan. 21, 2010

(30) Foreign Application Priority Data

Jun. 23, 2006 (DE) .......................... 10 2006 030 541

(51) Int. Cl.
*G01J 1/44* (2006.01)
*H01J 40/14* (2006.01)
*H03F 3/08* (2006.01)

(52) U.S. Cl. .............. 250/214 R; 250/214.1; 250/208.1; 257/431; 257/434

(58) Field of Classification Search .............. 250/208.2, 250/208.1, 221, 216, 231.13–231.18, 237 G, 250/214.1, 214 R; 257/431, 432, 433, 434, 257/435, 444; 359/74, 576, 579, 570, 571, 359/565, 656, 574
See application file for complete search history.

(56) References Cited

U.S. PATENT DOCUMENTS

| | | | | |
|---|---|---|---|---|
| 4,014,321 A | * | 3/1977 | March ........................... | 600/319 |
| 6,748,254 B2 | * | 6/2004 | O'Neil et al. ................. | 600/344 |
| 6,788,895 B2 | * | 9/2004 | Trezza ........................... | 398/9 |
| 6,933,532 B2 | | 8/2005 | Arnold et al. | |
| 7,485,847 B2 | * | 2/2009 | Degertekin et al. ........ | 250/237 G |
| 2002/0074551 A1 | * | 6/2002 | Kimura .......................... | 257/72 |
| 2004/0119989 A1 | * | 6/2004 | Mayer et al. ................. | 356/616 |
| 2004/0173865 A1 | * | 9/2004 | Scales et al. ................. | 257/449 |
| 2005/0053379 A1 | * | 3/2005 | Jockerst et al. .............. | 398/139 |
| 2005/0213983 A1 | * | 9/2005 | Shie et al. ..................... | 398/135 |
| 2006/0183986 A1 | * | 8/2006 | Rice et al. ..................... | 600/319 |
| 2006/0197960 A1 | * | 9/2006 | Bazylenko ................... | 356/491 |
| 2007/0195294 A1 | * | 8/2007 | Willey et al. ................. | 353/119 |
| 2008/0073424 A1 | * | 3/2008 | Ni ................................. | 235/380 |

FOREIGN PATENT DOCUMENTS

| | | |
|---|---|---|
| DE | 10061298 A1 | 6/2002 |
| EP | 1463117 A2 | 9/2004 |
| WO | 0246822 A1 | 6/2002 |
| WO | 2004006350 A2 | 1/2004 |
| WO | WO 2005006241 A2 * | 1/2005 |
| WO | WO 2005/103652   * | 11/2005 |

* cited by examiner

*Primary Examiner* — Francis M Legasse, Jr.
(74) *Attorney, Agent, or Firm* — Matthew B. Dernier, Esq.; Gibson & Dernier LLP

(57) ABSTRACT

The invention relates to optical arrangements which can be provided, preferably also in miniaturized form, for the most varied applications. They can be used in many sectors of life and also commercially, and indeed whenever information should be presented visually and/or optical information should be recognized and taken into account. It is the object of the invention to provide optical arrangements with which different optical information can be utilized in more complex form together in one arrangement. The optical arrangement in accordance with the invention is configured such that elements both emitting and detecting electromagnetic radiation are arranged on a common substrate or are configured thereat. A plurality of these elements are preferably present together in each case. It can, however, also be sufficient for specific applications to provide in each case an emitting or a detecting element with a plurality of the respective other elements.

20 Claims, 2 Drawing Sheets

OPTICAL ARRANGEMENT COMPRISING EMITTERS AND DETECTORS ON A COMMON SUBSTRATE

BACKGROUND OF THE INVENTION

The invention relates to optical arrangements which can be provided, preferably also in miniaturized form, for the most varied applications. They can be used in many sectors of life and also commercially, and indeed whenever information should be presented visually and/or optical information should be recognized and taken into account.

For example, "smart" displays can thus be made available which are particularly suitable for interactive uses.

The flood of the most varied information systems and environmental influences provides a correspondingly increasing number of demanded information, but also of information which has not been demanded, which has to be or should be processed or taken into account by humans. In this context, it is becoming more and more difficult to take account of their relevance or their respective importance, in particular when decisions have to be taken in a short time. However, a huge time effort is also required for the detection and also evaluation of the information.

Independently of this, the electronic systems have not substantially adapted to these problems in the past; the technical development has more or less remained unchanged and only adaptations and improvements to known solutions have been made.

Units or systems are thus known which reproduce, or also take up or store, optical and also acoustic information. They can also be evaluated in electronic form.

However, an activity by users is always required for interactive applications. Passively acting systems tend to be rare in use and are also limited in their effect. Too large a time delay also frequently occurs due to the required effort for the evaluation of information.

Suitable optical systems are configured either for detection, display, transmission or storage.

Different technologies for micro-displays for the visual display or presentation of information are thus in use. In this connection, light emitting diodes or also organic light emitting diodes are used. Other solutions such as LCOS (liquid crystal on silicon) or MEMS based micro-displays are only modulating and require additional light sources. The achievable contrast ratio is moreover small.

Organic light emitting diodes (OLEDs), in contrast, provide advantages. They can be manufactured with a greater area. They require smaller electrical powers with a corresponding luminance. However, they can also be made with a very small-size structure and so provide a higher resolution. Different wavelength ranges of electromagnetic radiation emitted by them can also be covered by them. For instance, monochrome radiation can be emitted, but also a larger spectrum up to white light.

Their manufacture is based on known technologies in which CMOS structures can be present on the rear side together with other active electronic elements.

However, pure image detections systems are also in use, such as electronic image taking systems (cameras), with which optical information can be detected, optionally provisionally stored, transmitted or immediately displayed on a separate display.

SUMMARY OF THE INVENTION

It is therefore the object of the invention to provide optical arrangements with which different optical information can be utilized in more complex form together in one arrangement.

This object is solved in accordance with the invention by an optical arrangement, comprising: at least one element operable to emit electromagnetic radiation; one or more elements operable to detect electromagnetic radiation manufactured in CMOS technology and arranged on a surface of a common CMOS substrate with the at least one element operable to emit electromagnetic radiation; and an electronic evaluation and control unit to which the at least one element operable to emit electromagnetic radiation and the one or more elements operable to detect electromagnetic radiation are connected.

The optical arrangement in accordance with the invention is configured such that elements both emitting and detecting electromagnetic radiation are arranged on a common substrate or are configured thereat. A plurality of these elements are preferably present together in each case. It can, however, also be sufficient for specific applications to provide in each case an emitting or a detecting element with a plurality of the respective other elements.

For example, an emitting element can thus be used with a plurality of detecting elements on an arrangement for an illumination of a forefield to be observed visually.

Emitting and detecting elements can be arranged discretely with respect to one another and next to one another so that they form a matrix or array arrangement separately from one another or together in each case.

It is in particular advantageous for interactive applications to provide a plurality of small-format emitting and detecting elements. They can then be arranged distributed uniformly and/or regularly over the surface of an arrangement. This should at least be the case within certain areal surface regions.

In this connection, the same surface ratios can also be observed over the total surface, i.e. surface portions which are respectively the same within the total surface of an arrangement or also within regions of the surface are associated with emitting and detecting elements. For example, electromagnetic radiation can thus be emitted by 60% and electromagnetic radiation can be detected over 40%. However, other ratios can also be selected matched to the respective application.

Light emitting diodes (LEDs) and/or organic light emitting diodes can preferably be used as elements emitting electromagnetic radiation on an optical arrangement, with organic light emitting diodes being further preferred since they can be integrated in CMOS technology.

Photodiodes and/or CMOS photodiodes can be present for a detection of incident electromagnetic radiation. The detection can, however, also take place with other elements which can be manufactured in CMOS technology such as CMOS photo transistors or CMOS photo field effect transistors.

In this connection, the selection can also be made while taking account of a desired wavelength selectivity of electromagnetic radiation. This, however, also applies in an analog manner to elements emitting radiation. The total visible or near infrared light, or also only a part range thereof, can thus e.g. be covered.

However, with a corresponding selection of elements, a correspondingly larger wavelength range can thus also be taken into account, that is both visible light and light in the near infrared range. In this connection, the sensitivities for the different wavelength ranges of the radiation for photodiodes and CMOS sensors can be taken into account and utilized.

For specific applications, an arrangement in accordance with the invention can, however, also be configured only for electromagnetic radiation in the wavelength range of non-visible light, preferably at larger wavelengths. For monitoring, illumination and detection can thus take place accordingly such that it cannot be recognized without additional aids suitable for this radiation.

An optical arrangement in accordance with the invention can be provided with a cover transparent to electromagnetic radiation at the side of the arrangement from which radiation can be emitted and via which incident radiation can be detected. Such a cover can also have an optical effect in addition to a protective function. For this purpose, optical structural elements can be provided on a cover and can be arranged with respect to emitting and/or detecting elements. The optical structural elements can achieve a focusing of the radiation or also a beam expansion (enlarging of the divergence).

A larger area can thus be illuminated, for example, image signals of a larger area can be detected with a different depth of field or optical information can be displayed in enlarged form. An optimization of the required size of an arrangement in accordance with the invention for an envisaged application can also thus be carried out in that, for example, the surface portion for detecting elements on a substrate can be kept smaller when the incident radiation is focused in the direction of detecting elements.

The emitting and the detecting elements are connected to an electronic evaluation and control unit. The actually different functions of the elements can thus be used in combination with one another, which can be harmonized very easily with the respective application.

The possibility thus exists of influencing the emitting elements by means of detecting elements. If, for example, changes in the functionality of emitting elements occur in operation, a luminance differing from defaults can occur, also detected in a locally differentiated manner over the surface of an arrangement in accordance with the invention, and then a control of all or of the respective emitting elements adapted to this circumstance can occur directly. This so-to-say forms an online regulation and separate calibrations can be dispensed with. In a similar form, however, the respective light conditions in the environment can also be taken into account and an adaptation of the luminance to emitted electromagnetic radiation can be carried out.

For interactive applications, however, information can be visually detected with detecting elements and then a reaction can take place by corresponding control of all or also of individual selected elements emitting electromagnetic radiation. There is, however, also the possibility of taking this visually detected information into account in another form.

For example, the most varied parameters can thus be optically detected. This can be the case, for example, in the monitoring of processes or also in the treatment of workpieces in which situations with varying conditions can occur. For example, a variation of emitted electromagnetic radiation in a process or at a workpiece or component can thus be detected and a reaction can take place with the information obtained and detected. This can take place, for example, by display or imaging on or by an arrangement in accordance with the invention. The information can, however, also be evaluated and further processed parallel thereto.

A use of the invention can also be employed with the most varied multimedia applications such as in the office, electronic games or in communications. A use is also possible in the sports sector, for example in interactive target devices for shooting sportsmen or for biathletes. A monitoring or maintenance of plant or machinery can be carried out in industry. It is also possible to detect and visually present logistical information.

However, physiological parameters of living beings can also be detected with the invention. For example, a detection on eyes of living beings can thus be carried out. The pulse of the blood circulation, the blood pressure and/or the respective attention of a living being can thereby be detected. For this purpose, an arrangement in accordance with the invention can be accommodated in a housing which can be placed onto at least one eye of a living being/creature. The housing can be at least regionally optically transparent for this purpose. The respective living being can thereby continue to visually observe the environment. The image information can be imaged in the housing by projection and can also be visually detected by the living being. The reaction of the living being can be detected and then be reacted on interactively by the possibility of optical detection. Information can be taken into account in different forms. For example, specific control signals can thus be generated for the influencing of elements emitting electromagnetic radiation. However, warning signals can also be generated if e.g. critical physiological parameters such as a reduced attention have been detected.

It can be advantageous for these applications, but also for other, in particular interactive applications, to operate elements emitting and detecting electromagnetic radiation alternatingly or also sequentially in another form. A changeover between emission and detection can thus be carried out at a presettable frequency. The frequency can be selected such that it cannot be detected with the human eye.

The elements emitting electromagnetic radiation can be configured on substrates in a form known per se. In addition, however, the elements detecting radiation can also be configured with a suitable structuring on the surface of the respective substrate or also be configured thereat. This can take place in CMOS technology. One or more elements emitting electromagnetic radiation can thus be configured as an organic light emitting diode or as organic light emitting diodes on a metal layer/electrode configured at the surface of a CMOS substrate. The emitting elements can each be controlled individually to achieve a locally direct emission of electromagnetic radiation. In this connection, the respective intensity/luminance and/or also the respective wavelengths, that is the color, of the emitted electromagnetic radiation can be influenced.

Further active and passive electronic/electrical components such as transistors or capacitors can also be present beneath emitting or also detecting elements for the amplification, storage and/or control of the individual elements.

There is, however, also the possibility of configuring integrated photodiodes at a substrate. An n-conductive region can be configured in an embodiment for this purpose for in each case one such detecting element within a p-conductive environment or at such a substrate. Such an n-conductive region can be configured as a well in the p-conductive material.

A substrate can be made of silicon which can optionally also be correspondingly doped.

BRIEF DESCRIPTION OF THE DRAWINGS

The invention will be explained in more detail by way of example in the following.

There are shown.

DETAILED DESCRIPTION OF THE EMBODIMENT(S)

Figure 1:
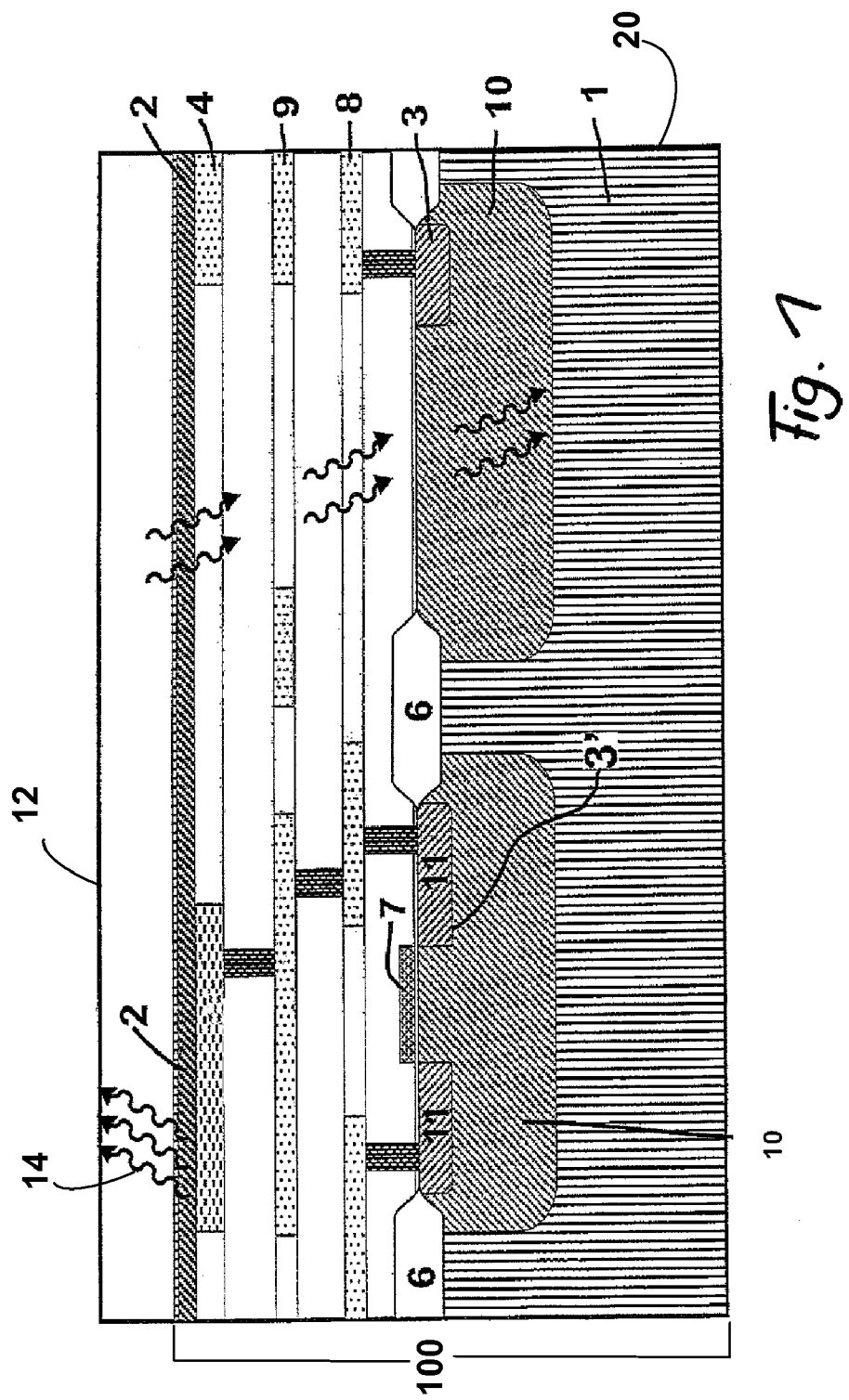
FIG. 1: a sectional representation through a part of an example of an arrangement in accordance with the invention.

A possible design of an example of an arrangement 100 in accordance with the invention can be seen from the schematic representation of FIG. 1. In this connection, a design with organic light emitting diodes 2, in an embodiment known per se, can be present on a substrate 1 made of silicon as elements emitting electromagnetic radiation. Metallic layers in a structured form are moreover configured which form electrical conductors and electronic components. A transistor 3' is thus associated with an organic light emitting diode 2. In one aspect, the arrangement 100 is accommodated in a housing 20 with at least a transparent portion 12 on which electromagnetic radiation 14 emitted by the elements 2 is imaged. In a further aspect, housing 20 is operable to be placed onto at least one eye of a living being/creature so that image information that is imaged in the housing 20 by projection can also be visually detected by the living creature.

In the example shown in FIG. 1, a photodiode 3, as an element detecting electromagnetic radiation, and a transistor 3' are formed. In this connection, well-shaped n-conductive regions 10 are formed in the substrate 1 which are separated from one another by field oxide 6. A gate 7 and channel implants 11 are formed in CMOS technology at the transistor 3'. The electrically conductive connection is established with the associated metallic conductor structure 8.

Organic light emitting diodes 2 and elements 3 emitting electromagnetic radiation can be arranged so that electromagnetic radiation can be incident between organic light emitting diodes and can be detected using elements 3 detecting electromagnetic radiation. For the case that organic light emitting diodes 2 transparent for electromagnetic radiation are present, an arrangement having such spacings between organic light emitting diodes 2 can optionally be dispensed with. The transparent organic light emitting diodes 2 can then be arranged above detecting elements 3 and can cover them. In this case, however, an alternating control with a switch between the emission and detection of electromagnetic radiation would be more favorable.

In the example shown here, metallic structures 4, 8 and 9 are configured in three planes for a control of the elements. However, such structures 4, 8 or 9 can also only be configured in two planes or in more than three planes.

Figure 2:
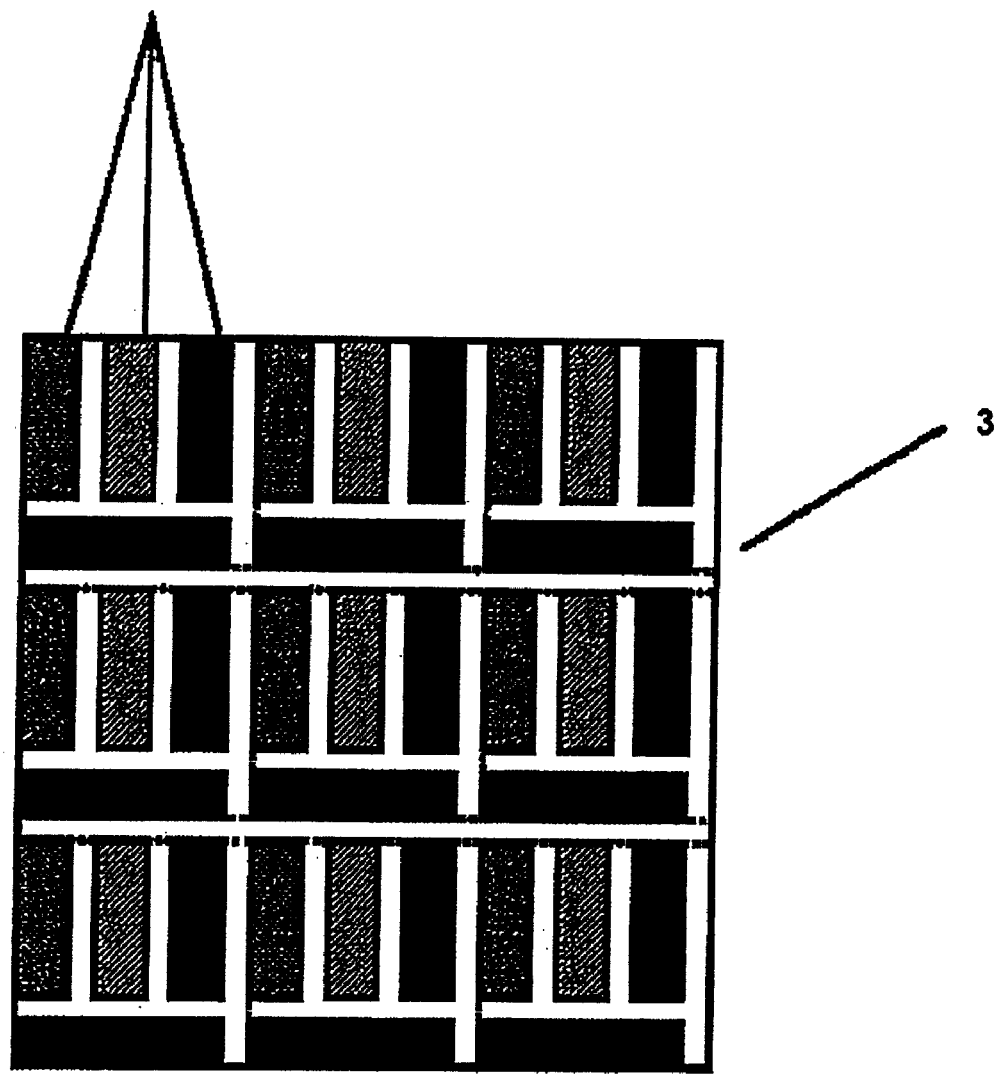
FIG. 2: a plan view of an example of an arrangement in accordance with the invention.

A possible arrangement should be illustrated by the plan view shown in FIG. 2 of an optical arrangement in accordance with the invention in an embodiment suitable as a display.

In this connection, in each case three organic light emitting diodes emitting electromagnetic radiation are arranged next to one another which emit electromagnetic radiation in the wavelength ranges of red, green and blue light. Corresponding detecting elements are then arranged in intermediate spaces. A regular arrangement of elements emitting and detecting electromagnetic radiation can thus be obtained.

The invention claimed is:

1. An optical arrangement, comprising:
a plurality of emitting elements operable to emit electromagnetic radiation;
a plurality of detecting elements operable to detect electromagnetic radiation, and which are manufactured in CMOS technology integrally within a CMOS substrate; and
an electronic evaluation and control unit to which the emitting elements and the detecting elements are connected,
wherein: (i) the emitting elements are arranged on a surface of the CMOS substrate, (ii) the emitting elements and the detecting elements are disposed discretely with respect to one another and next to one another such that they form an array arrangement together, the array arrangement operating to simultaneously display visual information, via the emitting elements, and detect optical information, via the detecting elements, and (iii) at least one of: (a) the emitting elements and the detecting elements are arranged such that electromagnetic radiation incident from the light emitting elements is detected by the detecting elements, and (b) the emitting elements are transparent to electromagnetic radiation and are arranged above and covering the detecting elements.

2. An arrangement in accordance with claim 1, further comprising a housing that accommodates the optical arrangement, wherein the housing is transparent at least regionally for the electromagnetic radiation.

3. An arrangement in accordance with claim 1, wherein the emitting elements are configured as organic light emitting diodes.

4. An arrangement in accordance with claim 1, wherein the detecting elements are configured as photodiodes or CMOS sensors.

5. An arrangement in accordance with claim 1, wherein the emitting elements and the detecting elements are arranged and distributed uniformly over the total surface of the arrangement.

6. An arrangement in accordance with claim 1, wherein the emitting elements cover the detecting elements.

7. An arrangement in accordance with claim 1, wherein the emitting elements and the detecting elements are configured for electromagnetic radiation in a wavelength range of visible light.

8. An arrangement in accordance with claim 1, wherein the emitting elements and the detecting elements are configured for electromagnetic radiation in a wavelength range of near infrared light.

9. An arrangement in accordance with claim 1, wherein the CMOS substrate includes a CMOS structure.

10. An arrangement in accordance with claim 1, wherein the detecting elements are barrier layer photodetectors.

11. An arrangement in accordance with claim 1, wherein the emitting elements are operable to be controlled by means of signals detected by the detecting elements.

12. An arrangement in accordance with claim 1, wherein the detecting elements comprise elements which are sensitive in different wavelength regions.

13. An arrangement in accordance with claim 1, wherein the housing is operable to be placed on at least one eye of a living being.

14. An arrangement in accordance with claim 1, wherein electromagnetic radiation is operable to be emitted and detected alternatingly or sequentially.

15. A method, comprising detecting physiological parameters of living beings using the arrangement in accordance with claim 1.

16. A method, comprising interactively applying the arrangement in accordance with claim 1 in connection with information or physiological parameters detected by the detecting elements.

17. An arrangement in accordance with claim 1, wherein the surface of the common CMOS substrate is protected by a cover transparent to electromagnetic radiation.

18. An arrangement in accordance with claim 17, wherein optical structural elements associated with the emitting elements and/or the detecting elements are configured at the cover.

19. An arrangement in accordance with claim 18, wherein the optical structural elements are operable to focus or split electromagnetic radiation.

20. An arrangement in accordance with claim 13, wherein electromagnetic radiation emitted by the emitting elements is imaged on a transparent part of the housing.

* * * * *